United States Patent
Thiruvengadam et al.

(10) Patent No.: US 9,082,477 B2
(45) Date of Patent: *Jul. 14, 2015

(54) SET PULSE FOR PHASE CHANGE MEMORY PROGRAMMING

(71) Applicant: Micron Technology, Inc., Boise, ID (US)

(72) Inventors: Aswin Thiruvengadam, Mather, CA (US); William Melton, Shingle Springs, CA (US); Rich Fackenthal, Carmichael, CA (US); Andrew Oen, Sacramento, CA (US)

(73) Assignee: Micron Technology, Inc., Boise, ID (US)

( * ) Notice: Subject to any disclaimer, the term of this patent is extended or adjusted under 35 U.S.C. 154(b) by 92 days.

This patent is subject to a terminal disclaimer.

(21) Appl. No.: 13/886,564

(22) Filed: May 3, 2013

(65) Prior Publication Data

US 2013/0242650 A1 Sep. 19, 2013

Related U.S. Application Data

(63) Continuation of application No. 13/156,293, filed on Jun. 8, 2011, now Pat. No. 8,441,848.

(51) Int. Cl.
*G11C 7/00* (2006.01)
*G11C 13/00* (2006.01)

(52) U.S. Cl.
CPC ........ *G11C 13/0009* (2013.01); *G11C 13/0004* (2013.01); *G11C 13/0069* (2013.01)

(58) Field of Classification Search
USPC ................................. 365/203, 230.03, 189.09
See application file for complete search history.

(56) References Cited

U.S. PATENT DOCUMENTS

| | | | |
|---|---|---|---|
| 6,115,285 A | 9/2000 | Montanari et al. | |
| 7,450,415 B2 * | 11/2008 | Kim et al. | 365/163 |
| 7,728,319 B2 * | 6/2010 | Goux et al. | 257/3 |
| 7,787,291 B2 | 8/2010 | Resta et al. | |
| 7,897,953 B2 | 3/2011 | Liu | |
| 8,036,016 B2 * | 10/2011 | Sarker et al. | 365/148 |
| 8,169,819 B2 * | 5/2012 | Shima et al. | 365/163 |
| 8,194,441 B2 * | 6/2012 | Thiruvengadam | 365/163 |
| 8,199,566 B1 * | 6/2012 | Fackenthal et al. | 365/163 |
| 8,441,848 B2 * | 5/2013 | Thiruvengadam et al. | 365/163 |

(Continued)

FOREIGN PATENT DOCUMENTS

| | | |
|---|---|---|
| JP | 2007-026644 | 2/2007 |
| JP | 2009-252253 | 10/2009 |
| WO | WO 2009/114200 A1 | 9/2009 |

OTHER PUBLICATIONS

Bedeschi et al., "A Bipolar-Selected Phase Change Memory Featuring Multi-Level Cell Storage", *IEEE Journal of Solid-State Circuits*; vol. 44, No. 1, Jan. 2009; pp. 217-227.

(Continued)

*Primary Examiner* — Pho M Luu
(74) *Attorney, Agent, or Firm* — Knobbe, Martens Olson & Bear LLP (57) ABSTRACT

A memory device and method for programming the memory device, including a method for a melting phase change memory cell by applying an electronic signal at a first value and subsequently decreasing the signal value. The phase change memory cell can be substantially crystallized after the decrease in signal value.

21 Claims, 7 Drawing Sheets

(56) References Cited

U.S. PATENT DOCUMENTS

| | | |
|---|---|---|
| 8,531,884 B2 | 9/2013 | Min et al. |
| 2009/0040813 A1 | 2/2009 | Kang et al. |
| 2010/0226168 A1 | 9/2010 | Savransky |
| 2011/0051507 A1 | 3/2011 | Sarkar et al. |
| 2011/0051508 A1 | 3/2011 | Eleftheriou et al. |

OTHER PUBLICATIONS

Bedeschi et al., "A Multi-Level-Cell Bipolar-Selected Phase-Change Memory", *IEEE International Solid-State Circuits Conference*; ISSCC 2008/Session 23/Non-Volatile Memory/23.5; pp. 428-429, 625.

Chao et al., "Multi-Level Phase Change Memory Using Slow-Quench Operation: GST vs. GSST", *IEEE*; 2009; pp. 39-40.

Kang et al., "Two-bit Cell Operation in Diode-Switch Phase Change Memory Cells with 90nm Technology", *IEEE-Symposium on VLSI Technology Digest of Technical Papers*; 2008; pp. 98-99.

Lee et al., "A 90nm 1.8V 512Mb Diode-Switch PRAM with 266MB/s Read Throughout", *IEEE International Solid-State Circuits Conference*; ISSCC 2007/Session 26/Non-Volatile memories/ 26.1; pp. 472-473, 616.

Lin et al., "Operation of Multi-Level Phase Change Memory Using Various Programming Techniques", *IEEE*; 2009; 4 pages.

Nirschl et al., "Write Strategies for 2 and 4-bit Multi-Level Phase-Change Memory", *IEEE*; 2007; pp. 461-464.

Philipp, et al, "Optimization of Phase Change RAM Write Performance for Large Memory Array, "IEEE, Sep. 23, 2009, 3 Pages.

Chinese Office Action dated Apr. 16, 2014 of corresponding Chinese Patent Application No. 201210182449.6 in 6 pages.

Korean Office Action dated Jul. 16, 2013 of corresponding Korean Patent Application No. 10-2012-60907.

Japanese Office Action dated Apr. 23, 2013 of corresponding Japanese Patent Application 2012-108094.

Taiwanese Office Action dated Sep. 5, 2014 of corresponding Taiwanese Patent Application No. 101116255.

\* cited by examiner

SET PULSE FOR PHASE CHANGE MEMORY PROGRAMMING

INCORPORATION BY REFERENCE TO ANY PRIORITY APPLICATIONS

This application is a continuation of U.S. application Ser. No. 13/156,293, now issued as U.S. Pat. No. 8,441,848, entitled SET PULSE FOR PHASE CHANGE MEMORY PROGRAMMING, filed Jun. 8, 2011, the entirety of which is hereby incorporated by reference herein.

BACKGROUND

1. Field

Subject matter disclosed herein relates to a memory device, and more particularly to a single pulse algorithm for programming a phase change memory.

2. Information

Phase change memory (PCM) may operate based, at least in part, on behavior or properties of one or more particular phase change materials, such as chalcogenide glass or germanium antimony telluride (GST), just to name a few examples. Electrical resistivities of crystalline or amorphous states of such materials may be different from one another, thus presenting a basis by which information may be stored. The amorphous, high resistance state may represent a stored first binary state and the crystalline, low resistance state may represent a stored second binary state. Of course, such a binary representation of stored information is merely an example: Phase change memory may also be used to store multiple memory states, represented by varying degrees of phase change material resistivity, for example.

In a PCM cell, transitioning from an amorphous state to a crystalline state may involve a transition period that is short enough to provide a relatively fast PCM write operation while being long enough to allow a transition from an amorphous state to a crystalline state. Accordingly, a transition period that is too short may result in a PCM cell comprising a mixture of material in an amorphous and a crystalline state, leading to an undefined memory cell state resulting in a failure of the PCM cell, for example.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Reference throughout this specification to "one embodiment" or "an embodiment" means that a particular feature, structure, or characteristic described in connection with an embodiment is included in at least one embodiment of claimed subject matter. Thus, appearances of phrases such as "in one embodiment" or "an embodiment" in various places throughout this specification are not necessarily all referring to the same embodiment. Furthermore, particular features, structures, or characteristics may be combined in one or more embodiments.

A phase change memory (PCM) cell, if used to store a binary logic value, may be set or reset to one of two states. For example, an amorphous, high resistance state may represent a stored first binary state and a crystalline, low resistance state may represent a stored second binary state. A PCM cell may be reset to an amorphous state by applying a relatively high amplitude, relatively short duration electrical programming pulse or signal so as to melt and then relatively quickly quench phase change material of the PCM cell. In a reset state, an active region of phase change material may comprise an amorphous region that is substantially dome-shaped, disposed adjacent to a resistive joule-heater element in a PCM cell. Crystallized phase change material may surround an amorphous region of phase change material. In a reset state, a PCM cell may have a relatively high electrical resistance. In a subsequent process, a PCM cell may be set to a crystalline state by crystallizing a dome-shaped amorphous region so that a substantially entire region of phase change material may become crystalline. A process may involve decreasing a signal level value of an electronic signal applied to a PCM cell to crystallize phase change material. In a set state, a PCM cell may have a relatively low electrical resistance. A process of crystallizing a dome-shaped amorphous region may be performed relatively quickly to benefit operational performance (e.g., programming speed) of a PCM cell. However, performing crystallization too quickly may result in non-crystallized amorphous regions or imperfections in phase change material, resulting in a higher-than-desired electrical resistance. A desired crystallization process may involve decreasing an electronic signal so as to provide time to crystallize a dome-shaped amorphous region without adversely producing amorphous regions or imperfections. A process of selecting a rate of decrease of an electronic signal to set a PCM cell may involve a trade-off between PCM write speed and assuring that a relatively high percentage of phase change material is crystallized, for example.

A memory device may include a plurality of PCM cells that may be arranged in an array. Due, at least in part, to variations in fabrication conditions from lot to lot or from region to region on a semiconductor wafer, for example, characteristics or physical parameters of PCM cells may vary among PCM cells. Physical parameters may include volume or dimensions of phase change material in a PCM cell, contact area between phase change material and a resistive heater, resistance of a resistive heater, just to name a few examples. Of course, variations may result from any of a number of situations or events. For another example, physical position of a PCM cell in a circuit may affect or modify physical parameters of the PCM cell. In particular, capacitance, magnetic or electric fields, or heat may contribute to variations. Thus, one portion of PCM cells in a PCM array may behave differently from another portion of PCM cells. For example, a rate at which a particular electronic signal affects some PCM cells may be different than for other PCM cells. Variations in physical or material parameters among PCM cells may be among a number of conditions leading to a variation in a rate at which a given electronic signal affects different PCM cells.

In an embodiment, a method of operating a PCM cell may involve applying an electronic signal to melt phase change material in the PCM cell. For example, an electronic signal may be applied to a resistive heater of a PCM cell during write operations performed by a memory controller, though claimed subject matter is not so limited. An electronic signal may be applied at a first particular signal value level so as to melt phase change material. The signal value level of the electronic signal being applied may be subsequently decreased after the phase change material is melted, until a second particular non-zero signal value level is reached. The signal value level may be decreased in a manner so that a substantially vertical drop in signal value level does not occur between the first particular signal value level and the second particular signal value level. For example, a rate of decrease of a signal value level may be less than about 0.3 to about 12.0 micro-amps per nanosecond (e.g., a rate of crystallization), though claimed subject matter is not so limited.

A method, such as that described above, may be applied to multiple PCM cells, which may be included in a PCM cell array, for example. In a case of multiple PCM cells, an electronic signal may be applied at a first particular signal value level to more than one resistive heater so as to melt phase change material of more than one PCM cell. Subsequent to melting phase change material of PCM cells, a signal value level may be decreased in a manner so that phase change material crystallizes from an outer periphery of the PCM cells inwardly, as explained in further detail below. In one implementation, a signal value level may be decreased according to an approximately linear ramp between a first particular signal value level corresponding to melted phase change material and a second particular signal value level. In one implementation, a second particular signal value level may correspond to a phase change material temperature that is at or below that of a PCM cell having a lowest crystallization temperature among a plurality of PCM cells.

In an embodiment, methods of operating a PCM cell may involve a device comprising a resistive heater to program PCM cells in an array of PCM cells in a manner so that a substantially vertical drop in temperature does not occur during programming of the cells of the array. A resistive heater may program cells of a PCM cell array by reducing temperature from a reset temperature level to a set temperature level, for example. A reset temperature may comprise a temperature at or above a highest melt temperature of any cell of an array. On the other hand, a set temperature level may comprise a temperature at or below a lowest crystallization temperature of any cell of an array.

A method of operating a PCM cell may involve applying an electronic signal comprising a single signal pulse to the PCM cell. A single signal pulse may be applied in a manner so as to reset and then set a plurality of PCM cells, some PCM cells reaching a crystallization temperature level at a different time than others. A single signal pulse may comprise a current pulse applied to heating elements of PCM cells. A single signal pulse may comprise a current pulse applied to PCM cells in a self heating cell architecture, wherein the PCM cells themselves include a heating element. A single signal pulse may be applied at an initial level so as to produce a temperature that corresponds to or exceeds a melt temperature for a PCM cell having a highest melt temperature of a plurality of PCM cells. A single signal pulse may be applied in a manner so that a plurality of PCM cells may substantially become fully crystallized. A single signal pulse may be applied in a manner so that a change in temperature results that is at or below a rate corresponding to the rate at which a slowest PCM cell among a plurality of PCM cells is able to substantially fully crystallize. A single signal pulse may produce a subsequent temperature that corresponds to or is below a temperature for a PCM cell having a lowest crystallization temperature among a plurality of PCM cells.

A method of operating a PCM cell, in one implementation, may be performed using an integrated circuit including a memory array comprising a plurality of PCM memory cells. A plurality of PCM memory cells may be substantially fully melted and then substantially fully crystallized via a single pulse without state verification of any of the plurality of PCM memory cells during application of the single pulse. As a counter example, a process of programming PCM cells to a particular state may be performed using multiple pulses separated by processes of verifying whether the PCM cells, or portions thereof, have been programmed to the particular state.

Figure 1:
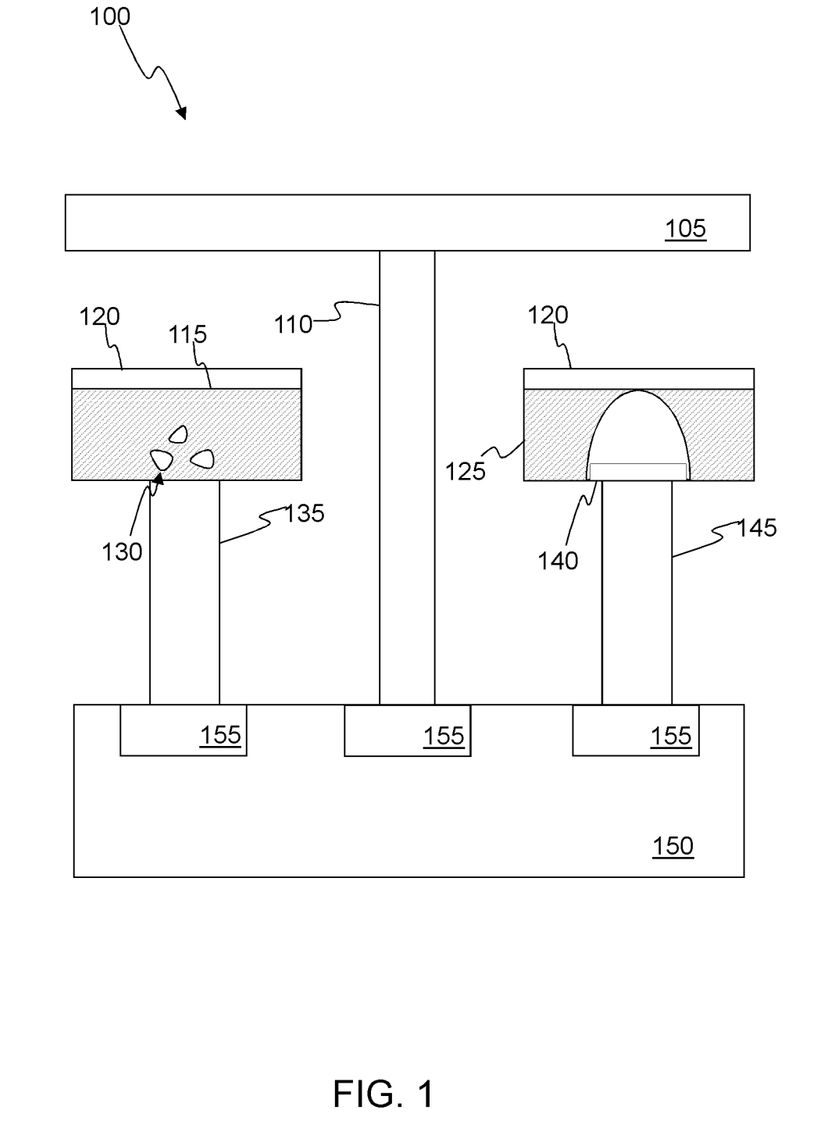
FIG. 1 is a schematic diagram of a portion of an embodiment of phase change memory.

FIG. 1 is a diagram of a portion of an embodiment of phase change memory 100. Such a portion is shown to include two memory cells, each memory cell being in a different memory state for illustrative purposes. A semiconductor substrate 150 may include N-doped regions 155, though other configurations, including the use of P-doped regions for example, may be used. Phase change memory 100 may include word lines 105, bit line 120, or word line contact 110. To represent one memory state, a heater 145 contacting a portion of phase change material 125 may heat to melt a portion 140 of phase change material 125, which may then be cooled relatively quickly to comprise amorphous germanium antimony telluride (GST), for example. An amorphous material may be relatively highly resistive, resulting in a high-resistance connection to a bitline contact 120. To represent another memory state, a heater 135 contacting a portion of phase change material 115 may heat to melt a portion of phase change material 115, which may then be cooled relatively slowly to comprise a crystalline or polycrystalline, low-resistance material. Polycrystalline phase change material 115 may thus lead to a low-resistance connection to contact 120. Of course, details of such a portion of a PCM are merely examples, and claimed subject matter is not so limited.

As indicated above, polycrystalline phase change material 115 may develop one or more imperfections 130, which may comprise non-crystallized amorphous regions, resulting from performing a crystallization process too quickly. Imperfections 130 may detrimentally increase resistance of a connection to bitline contact 120, leading to malfunctioning of the memory cell. For example, a failed memory cell may fail to read the binary value represented by the low-resistance state.

Figure 2:
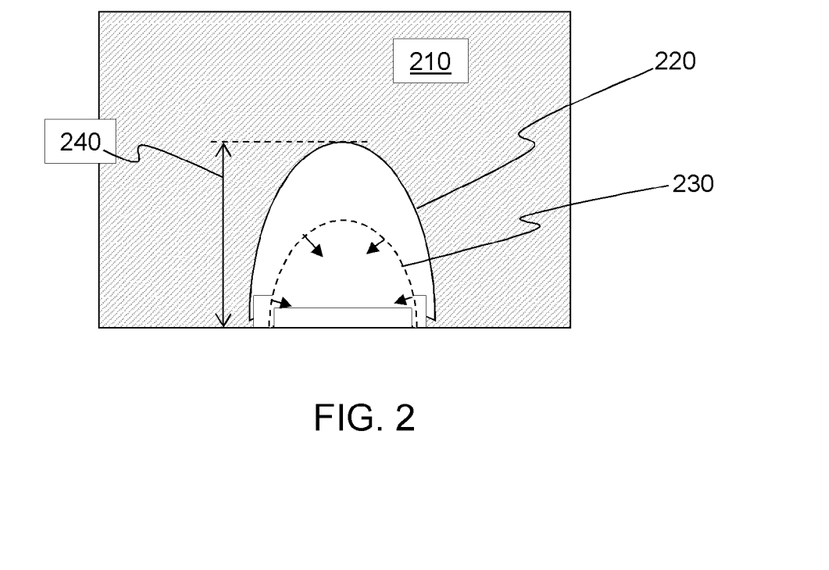
FIG. 2 is a cross-section of a portion of phase change material in an embodiment of a memory system.

FIG. 2 is a cross-section of a portion of polycrystalline phase change material 210 in an embodiment of a memory system. Portion 210 of phase change material may be similar to phase change material 125 shown in FIG. 1, for example. Within a particular time, a dome-shaped amorphous region 220 may shrink to a smaller size portion 230 in response to a decrease in signal value level of an electronic signal to crystallize dome-shaped amorphous region 220, as described above. As a signal value level of an electronic signal continues to decrease, smaller size portion 230 may continue to shrink until substantially an entire portion of amorphous region 220 becomes crystallized. A rate of such shrinkage or crystallization may be quantified in terms of a decrease in height 240 of dome-shaped amorphous region 220, for example. For a particular rate of decrease of an electronic signal applied to a plurality of PCM cells, a shrinkage or crystallization rate may vary among PCM cells, as mentioned above. For example, dome-shaped amorphous region 220 included in one PCM cell may crystallize more quickly than that of another PCM cell, even though both PCM cells may experience an identical electronic signal rate. Of course, such details of crystallization of phase change material are merely examples, and claimed subject matter is not so limited.

Figure 3:
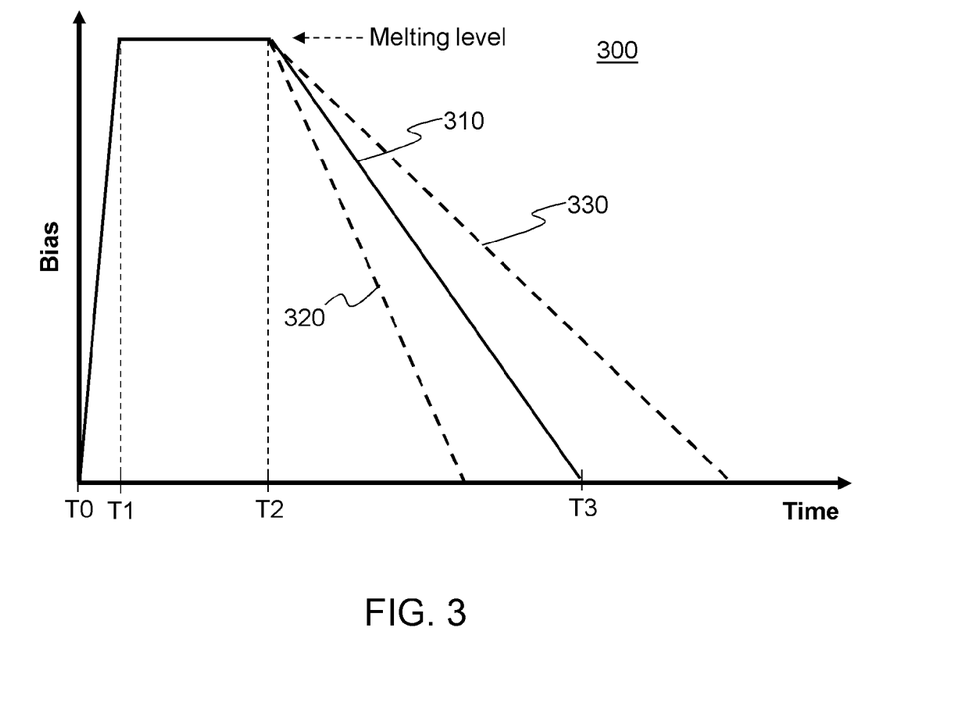
FIG. 3 is a plot of characteristics of an electronic signal wave-form in an embodiment of a memory system.

FIG. 3 is a plot of characteristics of a set pulse or electronic signal 300 including a set portion 310 which may comprise a decreasing ramp plotted against time in an embodiment of a memory system. Electronic signal 300 may comprise a time dependent single pulse to be applied to program a plurality of PCM cells, for example. Electronic signal 300 may include a connected, smooth signal path from a starting current to an ending current. For example, a parameter of electronic signal 300 may comprise a starting current that produces a temperature that corresponds to or exceeds a melt temperature for a PCM cell having a highest melt temperature of a plurality of PCM cells. Another parameter of electronic signal 300 may comprise an ending current that produces a temperature that corresponds to or is below a temperature for a PCM cell having a lowest crystallization temperature of a plurality of PCM cells.

From time T0 to time T1, electronic signal 300 applied to a PCM cell may be ramped-up to a melting level corresponding to a melting temperature of a phase change material during a process to reset the PCM cell, for example. A sufficiently high temperature may bring an active volume of phase change material of a PCM cell to a molten phase. From time T1 to time T2, such an amorphous, resistive phase may comprise a steady state of the active volume of the phase change material while electronic signal 300 remains substantially constant, though claimed subject matter is not so limited. Subsequently, from time T2 to time T3, a set process may include a ramping-down electronic signal 310 to crystallize the active volume of the phase change material. To achieve relatively fast operational performance, a set process may include applying an electronic signal having a relatively steep ramp-down slope 320 in order to crystallize phase change material at a relatively fast rate. However, as discussed above, if a ramp-down rate of an electronic signal is greater than a particular amount, such a rate may lead to imperfections or pocket regions of un-crystallized phase change material in a set state of a PCM cell. On the other hand, if a ramp-down rate of an electronic signal, such as ramp-down slope 330, is less than a particular amount, such a rate may lead to decreased performance (e.g., reduced program speed) of a PCM cell. Thus, a ramp-down portion of electronic signal 310 may be selected to have a slope for a desired operational performance of a PCM cell while achieving substantially complete crystallization of phase change material for a set state of the PCM cell. For example, a desired operational performance may be selected after making trade-offs among programming speed, programming reliability, or programming yield. Also, electronic signal 310 may be applied to a plurality of PCM cells in a manner so that a change in temperature results that is at or below a rate corresponding to the rate at which the PCM cell that is the slowest of the plurality to respond to the change in temperature is able to substantially fully crystallize.

As discussed above, due to variations in fabrication conditions, for example, characteristics or physical parameters of PCM cells in a PCM may vary. For example, a particular electronic signal may affect some PCM cells differently from other PCM cells. Accordingly, one portion of PCM cells in a PCM may behave differently from another portion of PCM cells in response to an applied electronic signal having a particular ramp-down slope. For example, a crystallization process using ramp-down slope 320 may be desired for one portion of PCM cells while being too fast (e.g., leading to imperfections in a phase change material) for another portion of PCM cells. Likewise, a crystallization process using ramp-down slope 330 may be desired for one portion of PCM cells while being slower than necessary (e.g., adversely affecting memory performance speed) for another portion of PCM cells. Accordingly, a medium ramp-down slope, such as that of ramp-down portion of electronic signal 310, may lead to a rate of crystallization that is too fast for some PCM cells, too slow for other PCM cells, and desired for yet other PCM cells. Selection of a ramp-down slope that may take into consideration PCM cell variations will be discussed in detail below.

Figure 4:
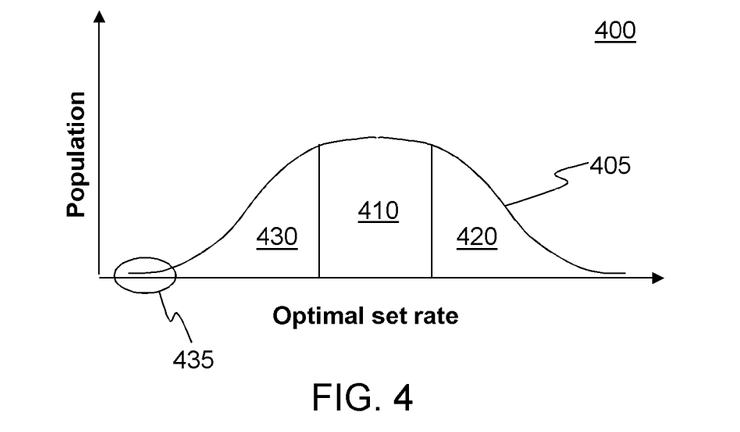
FIG. 4 is a plot showing a distribution of set rates for a population of memory cells in an embodiment of a PCM.

FIG. 4 is a plot showing a distribution 405 of desirable set rates for a population 400 of memory cells in a PCM, according to an embodiment. "Desirable" is not intended to represent a precise condition. Accordingly, "desirable set rate" loosely refers to an electronic signal set rate that is slow enough to allow substantially complete crystallization of a phase change material in a particular PCM cell (or population of like PCM cells) while being fast enough to provide relatively high speed memory performance, for example. As discussed above, a PCM device may include PCM cells having variations in a set rate due to variations in fabrication conditions of the PCM cells, for example. For example, as described above, a rate at which a particular electronic signal affects some PCM cells may be different than for other PCM cells. To illustrate an example using electronic signal 300 in FIG. 3, a process of setting PCM cells 420 may involve ramping-down an electronic signal at a particular rate corresponding to ramp-down slope 320; a process of setting PCM cells 430 may involve ramping-down an electronic signal at a particular rate corresponding to ramp-down slope 330, and a process of setting PCM cells 410 may involve ramping-down an electronic signal at a particular rate corresponding to ramp-down portion of electronic signal 310. A particular population 435 of PCM cells may correspond to a relatively small or gradual slope of a ramping-down bias signal. Compared to other PCM cell populations, particular population 435 may have the slowest rate of crystallization. This may be the case, for example, for PCM cells having relatively large volumes of phase change material or relatively small contact area between heater and phase change material, among other reasons. Of course, such a distribution of PCM cells is merely an example, and claimed subject matter is not so limited.

Figure 5:
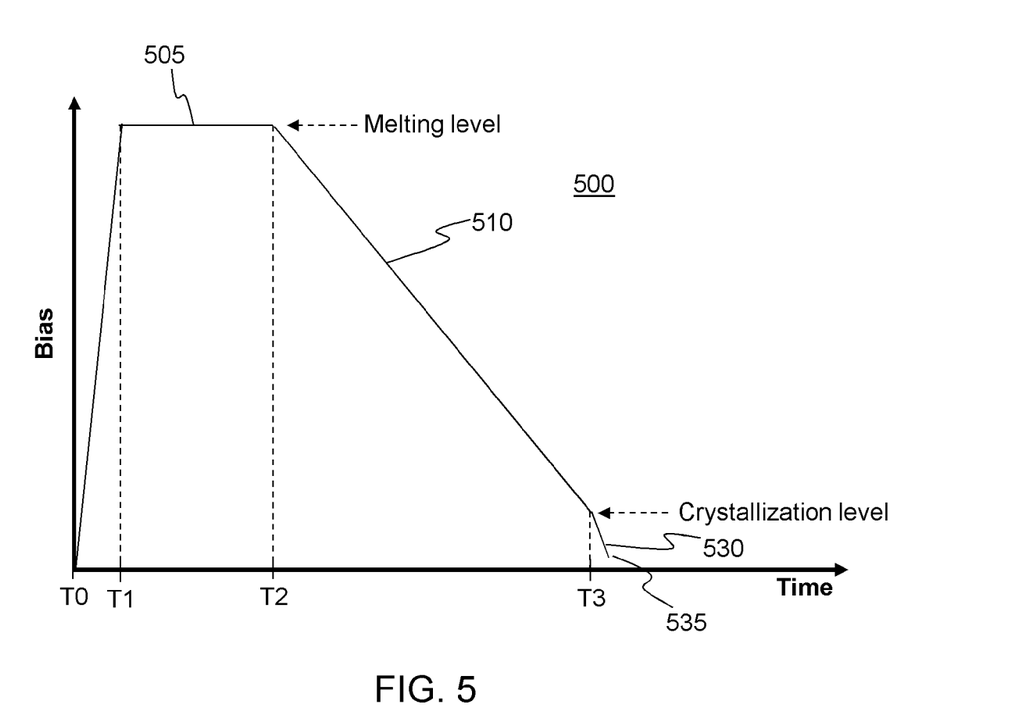
FIG. 5 is a plot of characteristics of an electronic signal wave-form in an embodiment of a memory system.

FIG. 5 is a schematic view of an electronic signal 500 that may be applied to a plurality of PCM cells, which may comprise the population represented in FIG. 4, for example. Electronic signal 500 may include a set portion 510 plotted against time. From time T0 to time T1, electronic signal 500 may be ramped-up to a melting level 505 corresponding to a melting temperature of a phase change material. From time T0 to time T1, electronic signal 500 may be applied to a plurality of PCM cells so as to produce a temperature that corresponds to or exceeds a melt temperature for a PCM cell having a highest melt temperature of the plurality. Subsequently, from time T2 to time T3, a set process may include ramping-down electronic signal 500 to crystallize the active volume of phase change material. In a particular implementation, electronic signal 500 may comprise a substantially linear portion 510 having a slope that decreases electronic signal 500 between times T2 and T3. Applying a ramping-down electronic signal comprising substantially linear portion 510 may provide benefits directed to improving the rate at which a population of PCM cells may be crystallized to a set state. In particular, crystallization may be carried-out substantially without generating imperfections or amorphous regions of phase change material in a final set structure. In one implementation, linear portion 510 of an electronic signal may be applied to a population of PCM cells having a distribution of desirable set rates, such as that shown in FIG. 4, for example. In an application, a slope of substantially linear portion 510 may be selected to correspond to particular population 435, which may have the slowest rate of crystallization relative to PCM cells of other populations. For example, a slope of substantially linear portion 510 may be selected to correspond to a rate of temperature change of phase change material of PCM cells of particular population 435 substantially equal to a rate of crystallization of these PCM cells. Electronic signal 500 may be applied to PCM cells so that a rate of crystallization during a set process may be linear with respect to a height of a dome-shaped active region of phase change material in the PCM cell.

Substantially linear portion 510 may extend to a crystallization level at time T3, upon or after which a slope 530 of electronic signal 500 may be increased to improve program speed. A crystallization level may correspond to a temperature at which phase change material of substantially all populations of PCM cells may be crystallized. In other words, a crystallization level may correspond to a temperature at which there may be a relatively high probability that phase change material of all PCM cells may be crystallized. A crystallization level of electronic signal 500 may be substantially equal to a read bias of substantially all populations of PCM cells. For example, for chalcogenide glass, read bias may comprise a value of about 1.3 volts, though claimed subject matter is not so limited. Electronic signal 500 may reach a non-zero signal value level 535 to conclude a process of setting PCM cells, though claimed subject matter is not so limited.

Figure 6:
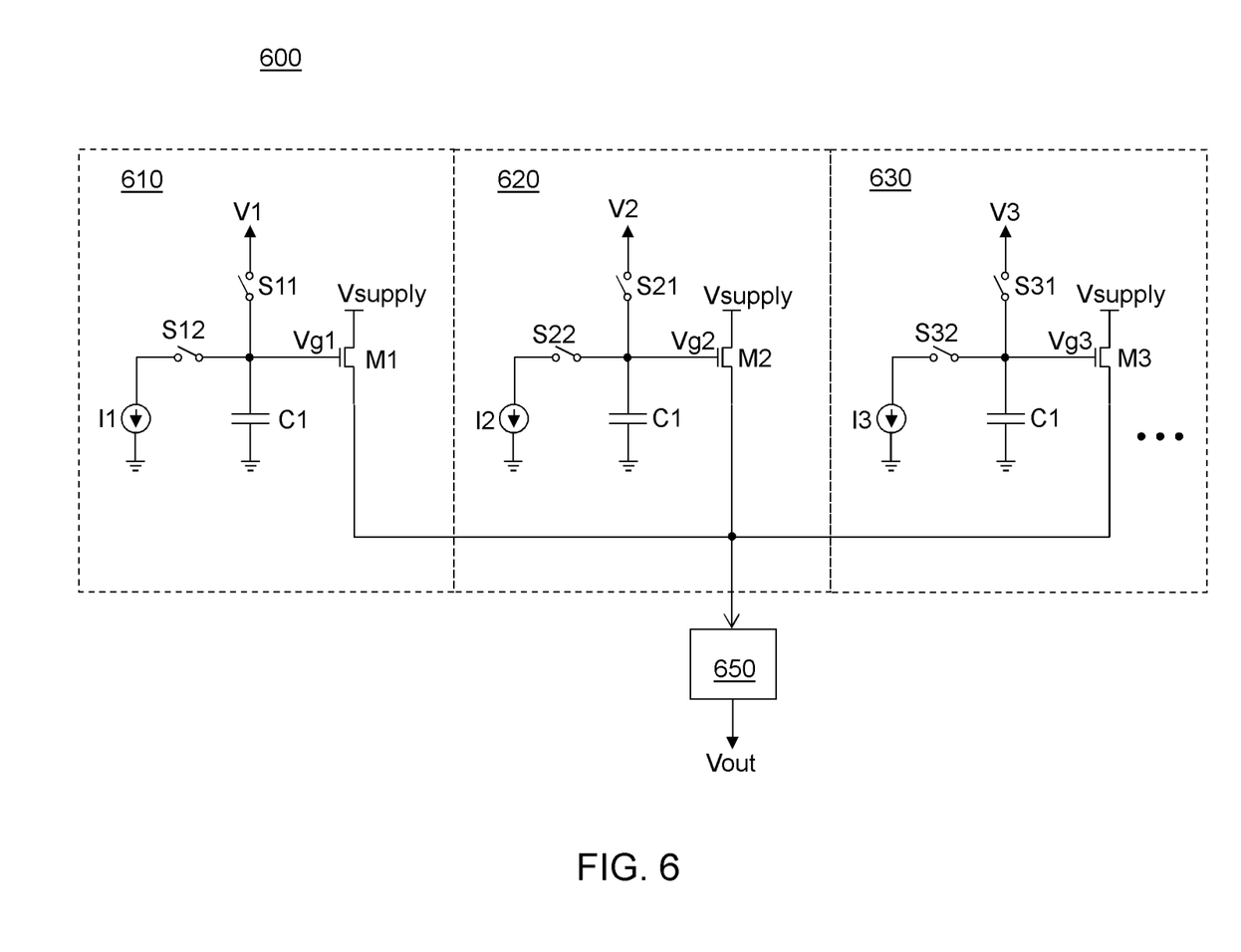
FIG. 6 is a schematic diagram of an electronic circuit to generate a set portion of an electronic signal in an embodiment of a memory system.

FIG. 6 is a schematic of an electronic circuit 600 to generate a set portion of an electronic signal in an embodiment of a memory system. Circuit 600 comprises merely one of many techniques for generating or producing a set portion of an electronic signal having various characteristics, for example, and claimed subject matter is not limited to any particular technique. Circuit 600 may comprise sub-circuits 610, 620, and 630 that include a transistor M1, M2, and M3, capacitor C1, C2, and C3, a current source I1, I2, and I3, two switches S11, S12, S21, S22, S31, and S32, and voltage V1, V2, and V3, respectively. Supply voltage Vsup may be provided to sub-circuits 610, 620, and 630. Circuit 600 may generate a voltage Vout to be applied to a PCM during a set process, for example. Vout may comprise a signal similar to electronic signal 500. In such a case, Vout may include a substantially linear portion 510 that may be piece-wise continuous, comprising one or more slopes that may be averaged over time by a resistor-capacitor (RC) combination 650. Though circuit 600 is herein described to comprise three sub-circuits 610, 620, and 630, a waveform generating circuit may comprise any number of sub-circuits. For example, circuit 600 may comprise additional sub-circuits. Accordingly, details of circuit 600 are merely examples, and claimed subject matter is not so limited.

Figure 7:
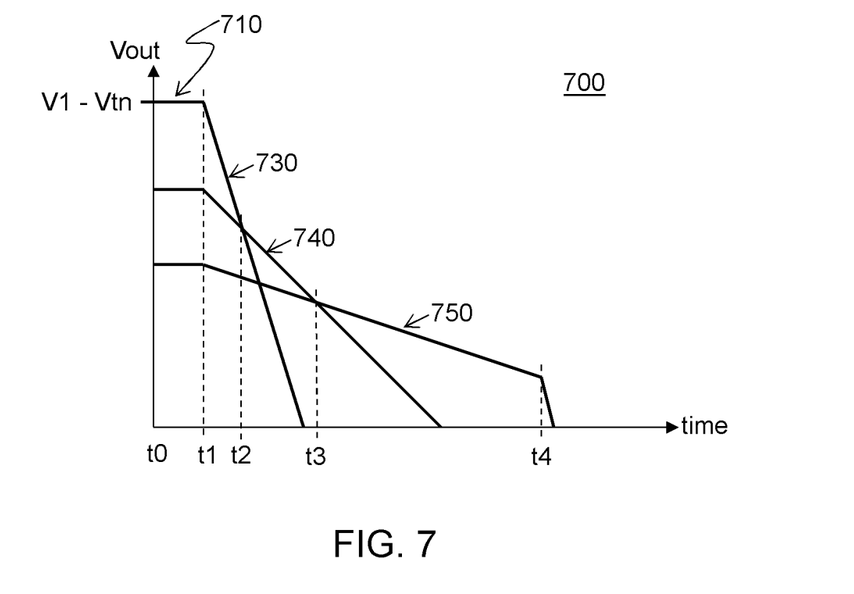
FIG. 7 is a plot of characteristics of components of a set portion of an electronic signal in an embodiment of a memory system.
Figure 8:
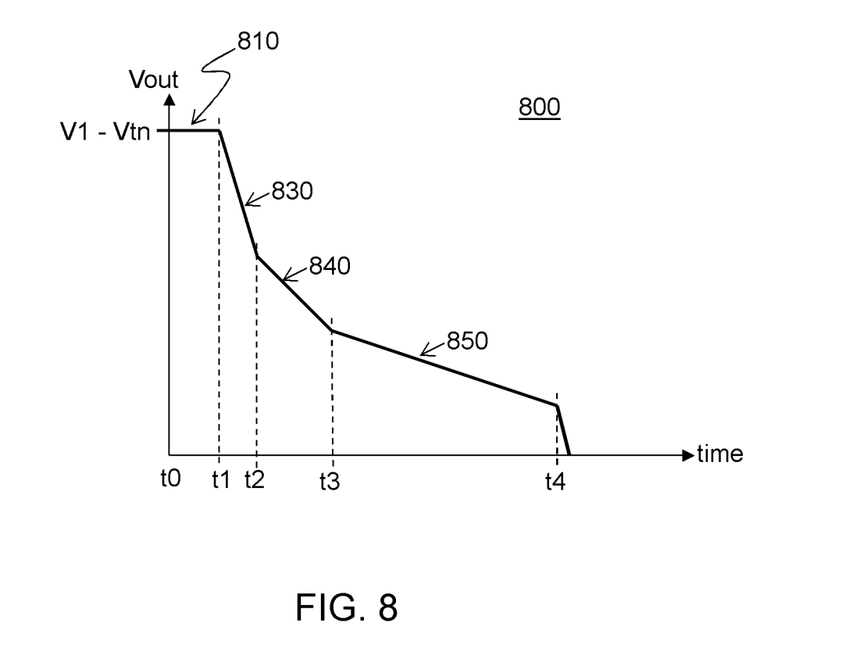
FIG. 8 is a plot of characteristics of a set portion of an electronic signal in an embodiment of a memory system.

FIGS. 7 and 8 are plots of characteristics of components of a set portion of an electronic signal that may be generated by circuit 600, for example. An electronic signal may be applied to a PCM cell during read or write operations by a memory controller, for example. In particular, waveforms 700 and 800 may comprise Vout plotted as a function of time, according to an embodiment. Returning to FIG. 6, initially, three switches, S11, S21, and S31 may be closed while three switches S12, S22, and S32 may be open. A configuration may initialize voltages Vg1, Vg2, and Vg3 to voltages V1, V2, and V3, respectively. V1 may be greater than V2 and V2 may be greater than V3. A situation may comprise an initial state 710 and 810 between t0 and t1. Before t1, three switches, S11, S21, and S31 may be opened and capacitors C1, C2, and C3 may store their respective voltages. At t1, three switches S12, S22, and S32 may close, connecting three independent current sources I1, I2, and I3 to capacitors C1, C2, and C3. In an implementation, I1 may be greater than I2 and I2 may be greater than I3. Capacitors C1, C2, and C3 may begin to discharge at rates different from one another: Vg1, beginning at a highest voltage V1 may discharge with a fastest slope 730, Vg2 at a slower rate 740, and Vg3 at a slowest rate 750. M1, M2, and M3 may comprise source-followers, so that Vout may follow approximately one of the gate voltages minus Vtn, wherein Vtn may comprise a threshold voltage of an N-channel MOSFET. The gate that Vout follows may comprise the gate at the highest potential in circuit 600. For example, just after t1 and before t2, since starting voltages V2 and V3 are less than V1, M1 may determine Vout so that Vout may be approximately Vg1-Vtn. M2 and M3 may be initially off if their source voltages, Vout, is higher than Vg2-Vtn or Vg3-Vtn, for example. Eventually, at t2, gate voltage of M1 may cross below that of M2. At this point, M2 may turn on while M1 transitions to a sub-threshold state and turns off. Accordingly, Vout may subsequently be determined by Vg2, with its slower ramp (smaller slope). At t3, as Vg2 crosses below Vg3, M2 may turn off, M3 may turn on, and Vout may subsequently follow M3 with a yet slower ramp rate. Of course, details of circuit 600 are merely examples, and claimed subject matter is not so limited.

FIG. 8 shows a three-part piece-wise-linear output voltage Vout, approximating a decreasing portion of a set ramp, for example. A piece-wise-linear curve may result from sub-circuits 610, 620, and 630 whose output voltage is individually shown in FIG. 7. A piece-wise-linear output voltage may be increasingly continuous (e.g., smooth) via additional sub-circuits in circuit 600 or using RC combination 650, for example. A selection of a number of sub-circuits may be based, at least in part, on a desirable resolution of a resulting output voltage. Though electronic signal resolution may increase, added sub-circuits may occupy additional space leading to circuit 600 having an undesirably large size.

Waveforms 700 or 800 may comprise a relatively quick voltage drop beginning at t4, as shown in FIGS. 7 and 8, for example. Though optional, applying a voltage having a quick transition to substantially zero to a PCM cell may provide benefits including improving operational performance of a PCM cell by ending a set process at a voltage below which there may be no further programming. In other words, rather than ramp all the way to zero volts, a set process may stop at approximately 1.3V, for example.

Though waveforms 700 or 800 are herein described to comprise three discrete slopes 830, 840, and 850, set portions of an electronic signal waveform may comprise any number of discrete slope values or ranges of continuous slope values. Accordingly, details of waveforms 700 and 800 are merely examples, and claimed subject matter is not so limited.

Figure 9:
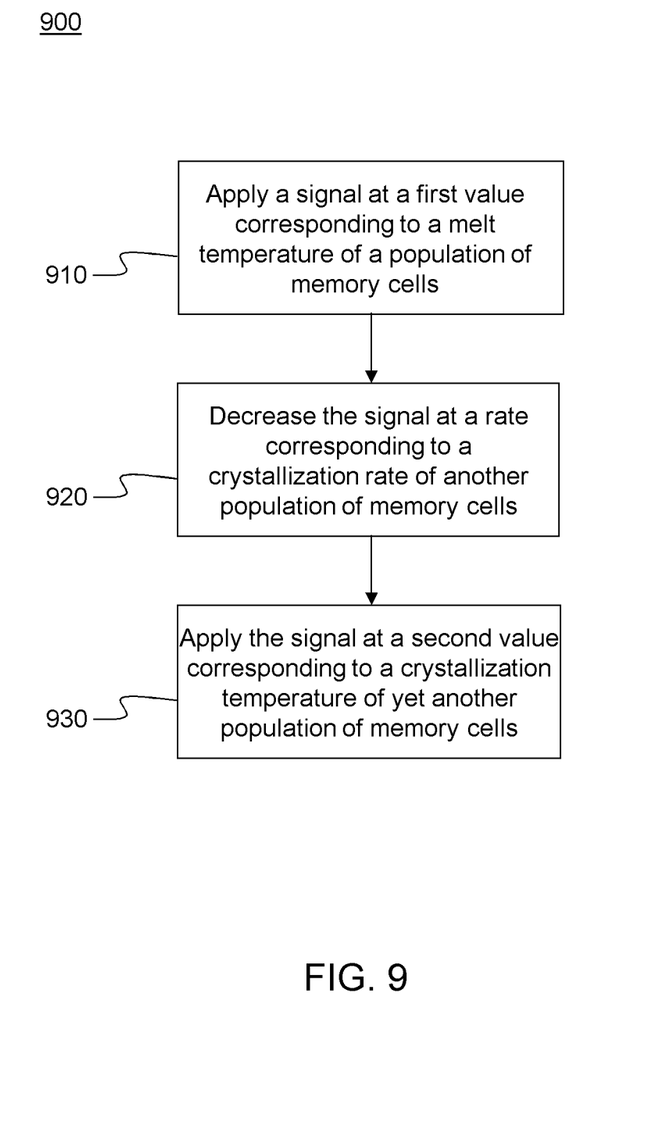
FIG. 9 is a flow diagram of a process of applying a set portion of an electronic signal to a memory cell in an embodiment of a memory system.

FIG. 9 is a flow diagram of a process 900 of applying an electronic signal to a plurality of PCM cells. Process 900 may involve a plurality of PCM cells that include populations of PCM cells having varying melt temperatures, crystallization rates, or crystallization temperature, among other possible characteristics. As discussed above, varying characteristics may result from variations in fabrication conditions of PCM cells, various placement of PCM cells in an electronic system, or any of a number of other possibilities, for example. Accordingly, one population of PCM cells may behave differently from another population of PCM cells. At block 910, a signal may be applied at a first value to a plurality of PCM cells. A first value may correspond to a melt temperature of a particular population of PCM cells that are among those having highest melt temperatures of the combined populations of PCM cells. A first value of a signal may also be approximately the same as a magnitude of a reset pulse to transition the particular population of PCM cells to a RESET state, for example.

Subsequently, at block 920, a signal may be decreased at a rate corresponding to a crystallization rate of another particular population of PCM cells that are among those having the slowest rate of crystallization of the combined populations of PCM cells. For example, as mentioned above regarding FIG. 4, particular population 435 may have a slowest rate of crystallization among a combined population 400 of PCM cells. Next, at block 930, a signal may be applied at a second value to a plurality of PCM cells. A second value may correspond to a crystallization temperature of yet another particular population of PCM cells that are among those having a lowest crystallization temperature of the combined populations of PCM cells. A second value of a signal may also be approximately the same as a magnitude of a read bias used to read PCM cells during a read operation, for example. Of course, such details of process 900 are merely examples, and claimed subject matter is not so limited.

Figure 10:
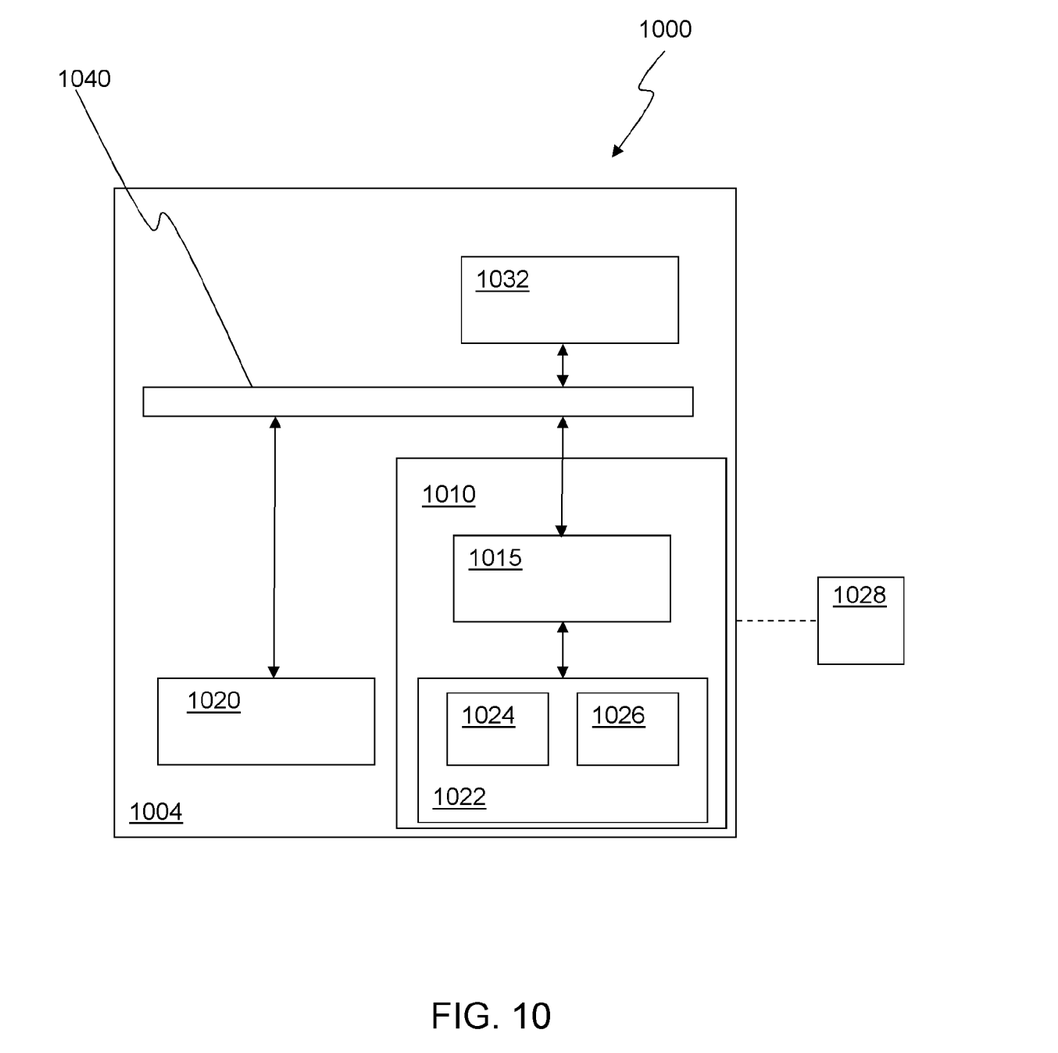
FIG. 10 is a schematic diagram illustrating an embodiment of a computing system.

FIG. 10 is a schematic diagram illustrating an embodiment of a computing system 1000 including a memory device 1010. For example, computing system 1000 may drive equipment capable of programming a plurality of PCM cells, and adjust parameters of a single pulse to be applied to program the plurality of PCM cells. Parameters may comprise a starting current, an ending current and a time dependent, connected, smooth signal path from a starting current to a ending current, for example. Computing system 1000 may include a capability to adjust parameters so as to make trade-offs between any of the following: programming speed, programming reliability, or programming yield. Computing system 1000 may include a capability to adjust parameters so as to reduce programming speed without significantly degrading nearly full crystallization of a plurality of PCM cells.

A computing device may comprise one or more processors, for example, to execute an application or other code. For example, memory device 1010 may comprise a memory that includes PCM 100, shown in FIG. 1. A computing device 1004 may be representative of any device, appliance, or machine that may be configurable to manage memory device 1010. Memory device 1010 may include a memory controller 1015 and a memory 1022. By way of example but not limitation, computing device 1004 may include: one or more computing devices or platforms, such as, e.g., a desktop computer, a laptop computer, a workstation, a server device, or the like; one or more personal computing or communication devices or appliances, such as, e.g., a personal digital assistant, mobile communication device, or the like; a computing system or associated service provider capability, such as, e.g., a database or data storage service provider/system; or any combination thereof.

It is recognized that all or part of the various devices shown in system 1000, and the processes and methods as further described herein, may be implemented using or otherwise including hardware, firmware, software, or any combination thereof. Thus, by way of example but not limitation, computing device 1004 may include at least one processing unit 1020 that is operatively coupled to memory 1022 through a bus 1040 and a host or memory controller 1015. Processing unit 1020 is representative of one or more circuits configurable to perform at least a portion of a data computing procedure or process. By way of example but not limitation, processing unit 1020 may include one or more processors, controllers, microprocessors, microcontrollers, application specific integrated circuits, digital signal processors, programmable logic devices, field programmable gate arrays, and the like, or any combination thereof. Processing unit 1020 may include an operating system configured to communicate with memory controller 1015. Such an operating system may, for example, generate commands to be sent to memory controller 1015 over bus 1040. Such commands may comprise read or write commands. In response to a write command, for example, memory controller 1015 may provide an electronic signal, such as electronic signal 500, described above.

Memory 1022 is representative of any data storage mechanism. Memory 1022 may include, for example, a primary memory 1024 or a secondary memory 1026. Primary memory 1024 may include, for example, a random access memory, read only memory, etc. While illustrated in this example as being separate from processing unit 1020, it should be understood that all or part of primary memory 1024 may be provided within or otherwise co-located/coupled with processing unit 1020.

Secondary memory 1026 may include, for example, the same or similar type of memory as primary memory or one or more data storage devices or systems, such as, for example, a disk drive, an optical disc drive, a tape drive, a solid state memory drive, etc. In certain implementations, secondary memory 1026 may be operatively receptive of, or otherwise configurable to couple to, a computer-readable medium 1028. Computer-readable medium 1028 may include, for example, any medium that can carry or make accessible data, code, or instructions for one or more of the devices in system 1000.

Computing device 1004 may include, for example, an input/output 1032. Input/output 1032 is representative of one or more devices or features that may be configurable to accept or otherwise introduce human or machine inputs, or one or more devices or features that may be configurable to deliver or otherwise provide for human or machine outputs. By way of example but not limitation, input/output device 1032 may include an operatively configured display, speaker, keyboard, mouse, trackball, touch screen, data port, etc.

It will, of course, be understood that, although particular embodiments have just been described, claimed subject matter is not limited in scope to a particular embodiment or implementation. For example, one embodiment may be in hardware, such as implemented on a device or combination of devices, for example. Likewise, although claimed subject matter is not limited in scope in this respect, one embodiment may comprise one or more articles, such as a storage medium or storage media that may have stored thereon instructions capable of being executed by a specific or special purpose system or apparatus, for example, to result in performance of an embodiment of a method in accordance with claimed subject matter, such as one of the embodiments previously described, for example. However, claimed subject matter is, of course, not limited to one of the embodiments described necessarily. Furthermore, a specific or special purpose computing platform may include one or more processing units or processors, one or more input/output devices, such as a display, a keyboard or a mouse, or one or more memories, such as static random access memory, dynamic random access memory, flash memory, or a hard drive, although, again, claimed subject matter is not limited in scope to this example.

In the preceding description, various aspects of claimed subject matter have been described. For purposes of explanation, specific numbers, systems, or configurations may have been set forth to provide a thorough understanding of claimed subject matter. However, it should be apparent to one skilled in the art having the benefit of this disclosure that claimed subject matter may be practiced without those specific details. In other instances, features that would be understood by one of ordinary skill were omitted or simplified so as not to obscure claimed subject matter. While certain features have been illustrated or described herein, many modifications, substitutions, changes, or equivalents may now occur to those skilled in the art. It is, therefore, to be understood that the appended claims are intended to cover all modifications or changes as fall within the true spirit of claimed subject matter.

What is claimed is:

1. A method comprising:
melting phase change material of a phase change memory (PCM) cell by applying an electronic signal at a first signal value to a heater of the PCM cell;
subsequently ramping down a signal value of the electronic signal from the first signal value to a second signal value, where ramping down occurs at a first ramp-down rate; and
ramping down the signal value of the electronic signal from the second signal value to a third signal at a second ramp-down rate, wherein the second ramp-down rate is different from the first ramp-down rate;
wherein the melted phase change material is substantially crystallized after reaching the second signal value.

2. The method of claim 1, wherein the second and third signal value levels are non-zero.

3. The method of claim 1, wherein the ramp-down rates are between about 0.3 to about 12.0 micro-amps per nanosecond.

4. The method of claim 1, further comprising applying melting and ramping down to each of a plurality of PCM cells, wherein each ramp-down rate is substantially the same as the rate of crystallization of a PCM cell of the plurality of PCM cells.

5. The method of claim 1, wherein each of the ramp-down rates is approximately linear.

6. The method of claim 1, further comprising applying melting and ramping down to each of a plurality of PCM cells, wherein the phase change material of the PCM cells are substantially crystallized after reaching the third signal value.

7. The method of claim 6, wherein the ramp-down rates are configured to avoid generating imperfections or amorphous regions in the plurality of PCM cells.

8. The method of claim 6, wherein at least one of the ramp-down rates is selected to correspond to a rate of crystallization of a PCM cell of the plurality of PCM cells with the slowest crystallization rate of the plurality of PCM cells.

9. The method of claim 6, wherein the value of the second or third signal is substantially equal to a magnitude of a read bias of substantially all of the plurality of PCM cells.

10. The method of claim 1, wherein the electronic signal is applied to a resistive heater.

11. The method of claim 1, wherein the electronic signal comprises a time-dependent single signal pulse.

12. The method of claim 1, wherein the signal value of the electronic signal is ramped down without a substantially vertical drop in the signal value.

13. An apparatus comprising:
a computing platform to drive equipment capable of melting and crystallizing phase change material of a PCM cell to program the PCM cell,
wherein the computing platform is capable of adjusting parameters of a single pulse to be applied to program the PCM cell,
wherein the parameters comprise:
an electric signal having a signal value;
at least a first, second, and third signal value; and
a first and second ramp-down rate, wherein the first and second ramp-down rates are different,
wherein the computing platform is configured to ramp down the signal value of the electric signal from the first signal value to the second signal value at the first ramp-down rate, and ramp down the signal value of the electric signal from the second signal value to the third signal value at the second ramp-down rate.

14. The apparatus of claim 13, wherein the second and third signal values are non-zero.

15. The apparatus of claim 13, wherein the computing platform is capable of melting and crystallizing phase change material in a plurality of PCM cells to program the plurality of PCM cells.

16. The apparatus of claim 13, wherein the electronic signal comprises a time-dependent single signal pulse.

17. The apparatus of claim 13, wherein the first signal value corresponds to a current that produces a temperature exceeding a melt temperature of the PCM cell.

18. The apparatus of claim 13, wherein the ramp-down rates are between about 0.3 to about 12.0 micro-amps per nanosecond.

19. The apparatus of claim 13, wherein each ramp-down rate is substantially the same as a rate of crystallization of a PCM cell of the plurality of PCM cells.

20. The apparatus of claim 13, wherein each of the ramp-down rates is approximately linear.

21. The apparatus of claim 15, wherein the ramp-down rates are configured to avoid generating imperfections or amorphous regions in the plurality of PCM cells.

* * * * *